(12) United States Patent
Kim et al.

(10) Patent No.: US 7,776,730 B2
(45) Date of Patent: Aug. 17, 2010

(54) SILOXANE POLYMER COMPOSITION, METHOD OF FORMING A PATTERN USING THE SAME, AND METHOD OF MANUFACTURING A SEMICONDUCTOR USING THE SAME

(75) Inventors: Kyoung-Mi Kim, Anyang-si (KR); Young-Ho Kim, Yongin-si (KR); Youn-Kyung Wang, Seongnam-si (KR); Mi-Ra Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 124 days.

(21) Appl. No.: 12/216,682

(22) Filed: Jul. 9, 2008

(65) Prior Publication Data
US 2009/0017592 A1     Jan. 15, 2009

(30) Foreign Application Priority Data
Jul. 9, 2007     (KR) .................... 10-2007-0068625

(51) Int. Cl.
*H01L 21/20* (2006.01)
*H01L 21/3205* (2006.01)
*H01L 21/4763* (2006.01)

(52) U.S. Cl. .................. 438/585; 438/393; 438/637; 257/E21.577; 257/E21.585

(58) Field of Classification Search ............ 438/393, 438/585, 637; 257/E21.577, E21.585
See application file for complete search history.

(56) References Cited

U.S. PATENT DOCUMENTS

| | | | |
|---|---|---|---|
| 2008/0038664 A1* | 2/2008 | Hamada et al. ........... | 430/270.1 |
| 2008/0142474 A1* | 6/2008 | Kim et al. ................. | 216/6 |
| 2008/0260956 A1* | 10/2008 | Sakurai et al. ............ | 427/387 |
| 2009/0278178 A1* | 11/2009 | Kawahara et al. ......... | 257/288 |

FOREIGN PATENT DOCUMENTS

| | | |
|---|---|---|
| JP | 10-261769 | 9/1998 |
| KR | 10-2002-0000349 A | 1/2002 |
| KR | 10-2004-0046704 A | 6/2004 |
| KR | 10-2004-0065024 A | 7/2004 |

* cited by examiner

*Primary Examiner*—Alexander G Ghyka
*Assistant Examiner*—Seahvosh J Nikmanesh
(74) *Attorney, Agent, or Firm*—Lee & Morse, P.C.

(57) ABSTRACT

A siloxane polymer composition includes an organic solvent in an amount of about 93 percent by weight to about 98 percent by weight, based on a total weight of the siloxane polymer composition, and a siloxane complex in an amount of about 2 percent by weight to about 7 percent by weight, based on the total weight of the siloxane polymer composition, the siloxane complex including a siloxane polymer with an introduced carboxylic acid and being represented by Formula 1 below,

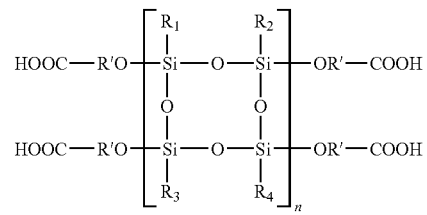

Formula 1 wherein each of $R_1$, $R_2$, $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5H_{10}$ or $C_6H_{12}$, and n represents a positive integer so the siloxane polymer of the siloxane complex has a number average molecular weight of about 4,000 to about 5,000.

14 Claims, 12 Drawing Sheets

SILOXANE POLYMER COMPOSITION, METHOD OF FORMING A PATTERN USING THE SAME, AND METHOD OF MANUFACTURING A SEMICONDUCTOR USING THE SAME

BACKGROUND OF THE INVENTION

1. Field of the Invention

Example embodiments of the present invention relate to a siloxane polymer composition, to a method of forming a pattern, and to a method of manufacturing a semiconductor device. More particularly, example embodiments of the present invention relate to a siloxane polymer composition for forming a siloxane layer capable of effectively filling an opening, to a method of forming a pattern using the siloxane polymer composition, and to a method of manufacturing a semiconductor device using the siloxane polymer composition.

2. Description of the Related Art

In general, a capacitor in a semiconductor memory device, e.g., in a dynamic random access memory (DRAM) device, may include a bottom electrode, a dielectric layer, and an upper electrode. To improve storage capacity of the semiconductor memory device, the capacitor may have a large capacitance despite its reduced size. For example, in a DRAM device having a large storage capacity, e.g., above one Giga bites, the capacitor may have a volumetric structure, e.g., a box structure or a cylindrical structure, with a high aspect ratio.

A conventional volumetric capacitor, e.g., a cylindrical capacitor, may have, e.g., a cylindrically shaped lower electrode, a dielectric layer, and an upper electrode. The conventional cylindrically shaped lower electrode may be formed using a photoresist buffer layer or an oxide buffer layer, e.g., during a process for separating or patterning adjacent lower electrodes.

For example, a conventional photoresist buffer layer may be formed by depositing a photoresist film on the lower electrode, followed by performing an exposure process, a developing process, a cleaning process, and a baking process on the photoresist film. Next, the photoresist film may be dried, e.g., using an isopropyl alcohol (IPA) solution, and removed, e.g., once adjacent lower electrodes are separated, via a plasma ashing process.

The processes in the conventional formation of the photoresist buffer film, however, may require an expensive exposure apparatus. Further, the conventional baking process may require baking the photoresist film at a relatively high temperature of about 270° C. or higher to prevent contamination of the drying apparatus, thereby making the subsequent removal of the buffer layer from the lower electrodes via the plasma ashing process difficult. As a result, since some portions of the conventional photoresist buffer layer may not be easily removed from the lower electrode by the plasma ashing process, remaining portions of the photoresist buffer layer on the lower electrode may cause an electrical failure of the capacitor. In addition, the plasma ashing process and a subsequent cleaning process for removing the conventional photoresist buffer layer from the lower electrode may deteriorate and/or oxidize the lower electrodes, e.g., when the plasma ashing process is performed at a relatively high temperature of about 150° C. to about 250° C. to improve removal of the conventional photoresist buffer layer. As a result, a volumetric capacitor having a conventional, e.g., cylindrically shaped, lower electrode may have low capacitance and poor electrical characteristics.

In another example, a conventional oxide buffer layer may be formed, e.g., by performing a spin coating process, a baking process, and an etch-back process. The conventional oxide buffer layer, however, may have poor flatness, i.e., may have non-uniform thickness, when formed in an opening having a relatively high aspect ratio by the spin coating process. When a cylindrical lower electrode is formed using a buffer layer having non-uniform thickness, lower electrodes of capacitors in a unit cell of a semiconductor memory device may have different heights, thereby having different capacitances. As a result, the semiconductor memory device may have poor electrical characteristics due to the non-uniform capacitance.

SUMMARY OF THE INVENTION

Embodiments of the present invention are therefore directed to a siloxane polymer composition, to a method of forming a pattern, and to a method of manufacturing a semiconductor device, which substantially overcome one or more of the disadvantages and shortcomings of the related art It is therefore a feature of example embodiments of the present invention to provide a siloxane polymer composition capable of uniformly filling an opening having a high aspect ratio.

It is another feature of example embodiments of the present invention to provide a siloxane polymer composition capable of being effectively removed using a tetramethyl ammonia hydroxide (TMAH) solution.

It is yet another feature of example embodiments of the present invention to provide a method of forming a pattern having a predetermined structure using a siloxane polymer composition with one or more of the above features.

It is still another feature of example embodiments of the present invention to provide a method of manufacturing a semiconductor device using a siloxane polymer composition with one or more of the above features.

At least one of the above and other features and advantages of the present invention may be realized by providing a siloxane polymer composition, including an organic solvent in an amount of about 93 percent by weight to about 98 percent by weight, based on a total weight of the siloxane polymer composition, and a siloxane complex in an amount of about 2 percent by weight to about 7 percent by weight, based on the total weight of the siloxane polymer composition, the siloxane complex including a siloxane polymer with an introduced carboxylic acid and being represented by Formula 1 below,

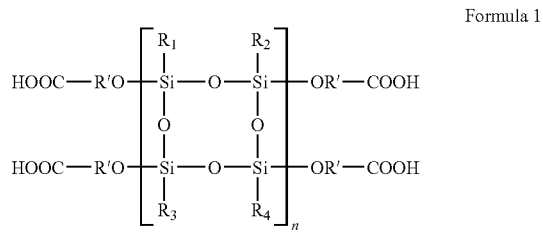

Formula 1 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5C_{10}$ or $C_6H_{12}$, and n represents a positive integer so the siloxane polymer of the siloxane complex has a number average molecular weight of about 4,000 to about 5,000.

The siloxane complex may be a reaction product of a siloxane polymer represented by Formula 2 below and a carboxylic acid chloride (R'—Cl—COOH),

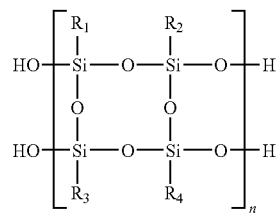

Formula 2 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5C_{10}$ or $C_6H_{12}$, and n represents a positive integer so the siloxane polymer of the siloxane complex has a number average molecular weight of about 4,000 to about 5,000. The siloxane polymer represented by Formula 2 may be a crosslinking product of a siloxane compound represented by Formula 3 below,

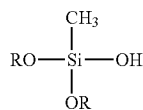

wherein RO represents an alkoxyl group or a hydroxyl group having one carbon atom to five carbon atoms. The siloxane complex may have a polydispersity index (PDI) of about 1.3 to about 1.8. The organic solvent may include at least one of methanol, ethanol, butanol, propanol, isopropyl alcohol, n-butanol, 1-methoxy-2-propanol, methoxypropyl acetate, propylene glycol monomethyl ether, propylene glycol monomethyl ether acetate, isobutyl alcohol, and t-butyl alcohol.

At least one of the above and other features and advantages of the present invention may be also realized by providing a method of forming a pattern, including forming an opening through an insulation layer on a substrate, the opening partially exposing the substrate, forming a conductive layer in the opening and on the insulation layer, forming a siloxane layer on the conductive layer to fill the opening, the siloxane layer including an organic solvent in an amount of about 93 percent by weight to about 98 percent by weight, based on a total weight of the siloxane layer, and a siloxane complex in an amount of about 2 percent by weight to about 7 percent by weight, based on the total weight of the siloxane layer, the siloxane complex including a siloxane polymer with an introduced carboxylic acid and being represented by Formula 1 below,

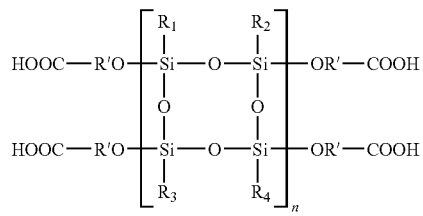

Formula 1 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5C_{10}$ or $C_6C_{12}$, and n represents a positive integer so the siloxane polymer of the siloxane complex has a number average molecular weight of about 4,000 to about 5,000, forming a siloxane pattern in the opening by partially removing the siloxane layer, and forming a conductive layer pattern by etching the conductive layer using the siloxane pattern as an etching mask.

The method may further include forming the conductive layer on the substrate, sidewalls of the opening, and the insulation layer, forming a preliminary siloxane layer on the conductive layer to fill the opening, forming the siloxane layer by hardening the preliminary siloxane layer, and removing the siloxane layer pattern and the insulation layer after forming the conductive layer pattern. Hardening the preliminary siloxane layer may include a baking process performed at a temperature of about 90° C. to about 110° C. The siloxane pattern and the insulation layer may be removed simultaneously. The siloxane pattern and the insulation layer may be removed using an etching solution including a hydrogen fluoride solution, an ammonium fluoride solution, and deionized water. The siloxane pattern may be formed by partially removing the siloxane layer using a tetramethyl ammonium hydroxide (TMAH) solution.

At least one of the above and other features and advantages of the present invention may be also realized by providing a method of manufacturing a semiconductor device, including forming a mold layer on a substrate with a conductive structure, the mold layer having an opening exposing the conductive structure, conformally forming a conductive layer on the conductive structure, sidewalls of the opening, and the mold layer, forming a siloxane layer on the conductive layer to fill the opening, the siloxane layer including an organic solvent in an amount of about 93 percent by weight to about 98 percent by weight, based on a total weight of the siloxane layer, and a siloxane complex in an amount of about 2 percent by weight to about 7 percent by weight, based on the total weight of the siloxane layer, the siloxane complex including a siloxane polymer with an introduced carboxylic acid and being represented by Formula 1 below,

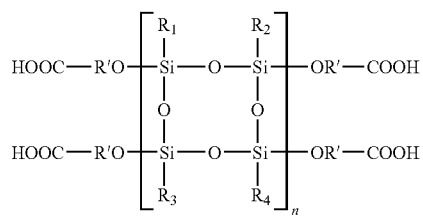

Formula 1 wherein each of $R_1$, $R_2$, $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5C_{10}$ or $C_6H_{12}$, or n represents a positive integer so the siloxane polymer of the siloxane complex has a number average molecular weight of about 4,000 to about 5,000, forming a siloxane pattern in the opening by partially removing the siloxane layer using a TMAH solution, forming a lower electrode by partially removing the conductive layer from the mold layer by using the siloxane pattern as an etching mask, removing the siloxane pattern and the mold layer, forming a dielectric layer on the lower electrode, and forming an upper electrode on the dielectric layer.

The siloxane layer may be formed by baking a composition of the siloxane complex and organic solvent at a temperature of about 90° C. to about 110° C., and the siloxane polymer of the siloxane complex may be formed by using a fractional distillation process on a crosslinking product of a siloxane compound. The siloxane complex may be obtained by reacting a carboxylic acid chloride (R'—Cl—COOH) with a hydroxyl group of a siloxane polymer having a number average molecular weight of about 4,000 to about 5,000, and may be represented by Formula 2 below,

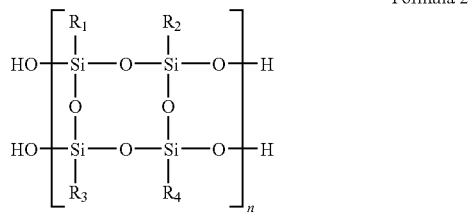

Formula 2 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5C_{10}$, or $C_6H_{12}$, or n represents a positive integer so the siloxane polymer has the number average molecular weight of about 4,000 to about 5,000. The siloxane complex may have a PDI of about 1.3 to about 1.8. The siloxane complex may be represented by Formula 4 below,

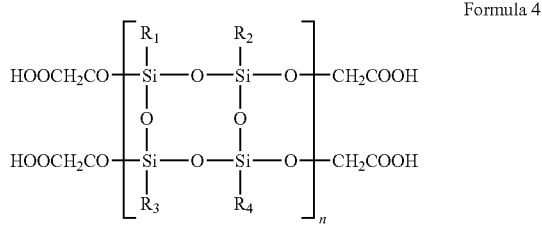

Formula 4 wherein each of $R_1$, $R_2$ $R_3$, and $R_4$ independently represents H, OH, $CH_3$, $C_2H_5$, $C_3H_7$, $C_4H_9$ or $C_5H_{11}$, and n represents a positive integer so the siloxane polymer has the number average molecular weight of about 4,000 to about 5,000. The siloxane pattern and the mold layer may be removed simultaneously. The siloxane pattern and the mold layer may be removed using an etching solution including a hydrogen fluoride solution, an ammonium fluoride solution, and deionized water.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
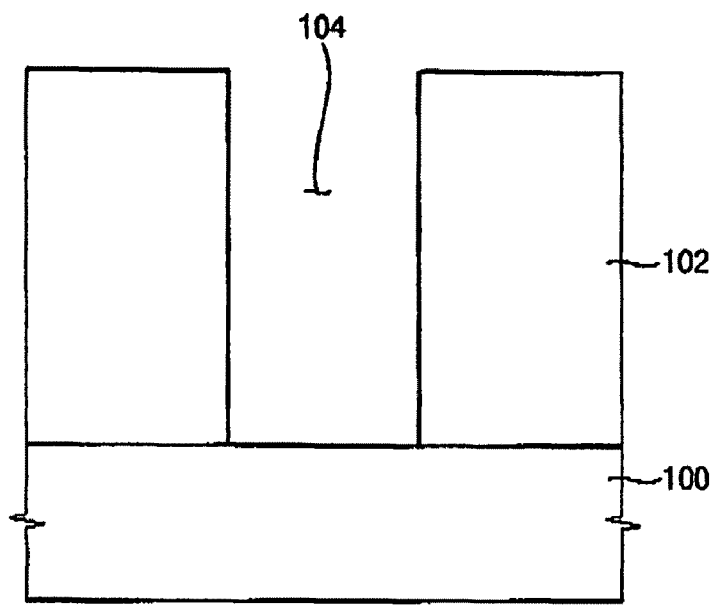
FIGS. 1-6 illustrate cross-sectional views of sequential steps in a method of forming a pattern in accordance with example embodiments of the present invention.

Korean Patent Application No. 10-2007-0068625, filed on Jul. 9, 2007, in the Korean Intellectual Property Office, and entitled: "Siloxane Polymer Composition, Method of Forming a Pattern and Method of Manufacturing a Semiconductor Device," is incorporated by reference herein in its entirety.

Exemplary embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate solely a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Further, it will be understood that when an element and/or layer is referred to as being "connected to" or "coupled to" another element and/or layer, it can be directly connected or coupled to the other element and/or layer, or intervening elements and/or layers may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments of the present invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are open terms that may be used in conjunction with singular items or with plural items.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Siloxane Polymer Composition

A siloxane polymer composition according to example embodiments may include an organic solvent and a siloxane complex. The siloxane polymer composition may include about 93 percent by weight to about 98 percent by weight of the organic solvent and about 2 percent by weight to about 7 percent by weight of the siloxane complex. The siloxane complex of the siloxane polymer composition may include a siloxane polymer with an introduced carboxylic acid, and may be represented by Formula 1 below.

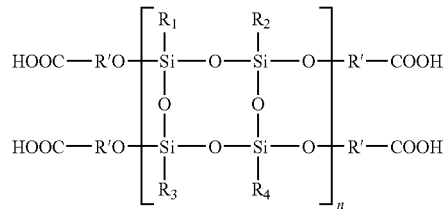

Formula 1 wherein each of $R_1$, $R_2$, $R_3$, and $R_4$ may independently represent hydrogen H, OH, $CH_3$, $C_2H_5$, $C_3H_7$, $C_4H_9$, or $C_5H_{11}$, and R' may represent $CH_2$, $C_2H_4$, $C_3H_6$, $C_4H_8$, $C_5H_{10}$, or $C_6H_{12}$. Further, n may represent a positive integer for providing a desired number average molecular weight of the siloxane polymer as will be described in more detail below.

The siloxane polymer composition may be used to form a siloxane layer in an opening or in a hole having a relatively high aspect ratio, so the formed siloxane layer may provide sufficient and uniform coverage of the opening or hole. For example, the siloxane layer may be formed to a substantially uniform thickness in the opening, so a vertical distance from a common reference point on an upper surface of a substrate to an upper surface of the siloxane layer may be substantially the same in central and peripheral portions of the opening. Further, the formed siloxane layer including the siloxane polymer composition may be effectively formed on a pattern or a on a structure, e.g., of a semiconductor device, by a spin coating process as a buffer layer, and may be substantially completely removed via dissolution in a tetramethyl ammonium hydroxide (TMAH) solution after the pattern is complete.

The siloxane complex in the siloxane polymer composition may be obtained by reacting a siloxane polymer represented by Formula 2 below with a carboxylic acid chloride (R'—Cl—COOH), so the chloride of the carboxylic acid chloride (R'—Cl—COOH) may react with OH groups in the siloxane polymer represented by Formula 2 to form the siloxane complex represented by Formula 1. In Formula 2 below, each of $R_1$, $R_2$, $R_3$, and $R_4$ may independently represent H, OH, $CH_3$, $C_2H_5$, $C_3H_7$, $C_4H_9$, and $C_5H_1$, and n may represent a positive integer for providing the desired number average molecular weight of the siloxane polymer.

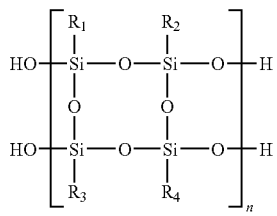

Formula 2

For example, the siloxane complex may be obtained by reacting about 100 parts by weight of the siloxane polymer represented by Formula 2 with about 300 parts by weight of the carboxylic acid chloride, e.g., acetic acid chloride, followed by extracting the reaction product, i.e., the siloxane complex represented by Formula 1, with an organic solvent. In a reaction between the siloxane polymer and the carboxylic acid chloride, hydrogen chloride (HCl) may be formed. Examples of the carboxylic acid chloride may include $CH_2ClCOOH$, $C_2H_4ClCOOH$, $C_3H_6ClCOOH$, $C_4H_8ClCOOH$, $C_5H_{10}ClCOOH$, etc.

The siloxane polymer used to form the siloxane complex may be quantified, i.e., purified, by a fractional distillation process of a crosslinking product of a silicon compound represented by Formula 3 below,

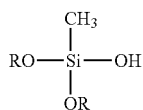

Formula 3 wherein OR may represent an alkoxyl group or a hydroxyl group having about 1 carbon atom to about 5 carbon atoms. Examples of the alkoxyl group may include methoxide, ethoxide, iso-propoxide, butoxide, and so forth. The siloxane polymer may have a number average molecular weight of about 4,000 to about 5,000. For example, the siloxane complex may be formed of a quantified siloxane polymer having a number average molecular weight of about 4,200 to about 4,900.

The siloxane polymer may include a plurality of different siloxane polymer components, e.g., a first siloxane polymer component, a second siloxane polymer component, and a third siloxane polymer component different from each other, so the number average molecular weight of the plurality of siloxane polymer components may be about 4,000 to about 5,000. For example, the first siloxane polymer component may have a number average molecular weight of about 6,000 to about 8,000, the second siloxane polymer component may have a number average molecular weight of about 4,000 to about 5,000, and the third siloxane polymer component may have a number average molecular weight of about 3,000 to about 4,000. Thus, the siloxane polymer may include the first siloxane polymer component as a main component, and proportions of the first through third siloxane polymer components may be adjusted to form the siloxane polymer having a number average molecular weight of about 4,000 to about 5,000. For example, if a plurality of siloxane polymer components are used to form the siloxane polymer, a quantified siloxane polymer may be obtained by a fractional distillation method because the different siloxane polymer components may have different number average molecular weights and different melting points, respectively.

When the siloxane polymer has a number average molecular weight of about 4,000 to about 5,000, the siloxane polymer may impart a desired solubility to a siloxane layer with respect to a TMAH solution. When the siloxane polymer has a number average molecular weight above about 5,000, the siloxane polymer composition may have poor solubility relative to the TMAH solution, so removal of the siloxane layer may be poor. When the siloxane polymer has a number average molecular weight of below about 4,000, the siloxane polymer composition may dissolve in the TMAH solution too rapidly. Accordingly, the siloxane polymer may have a number average molecular weight of about 4,000 to about 5,000 to impart proper solubility to the siloxane layer in the TMAH solution, so the siloxane layer may be easily removed using the TMAH solution.

The siloxane complex may have a polydispersity index (PDI) of about 1.3 to about 1.8, so density of the resultant siloxane layer may be improved. When the siloxane complex has PDI below about 1.3, the resultant siloxane layer may not sufficiently dissolve in the TMAH solution. When the siloxane complex has a PDI above about 1.8, the siloxane polymer composition may require baking at a relatively high temperature, e.g., about 130° C. or higher, in order to form the siloxane layer. Thus, the siloxane complex may have a PDI of about 1.3 to about 1.8.

It is noted that both the number average molecular weight of the siloxane polymer and the PDI of the siloxane complex may be adjusted to improve solubility of the siloxane polymer composition in the TMAH solution. For example, two siloxane polymer compositions with siloxane polymers having comparable number average molecular weights, e.g., about 4,600 and 4,000, may have different solubilities if the PDIs of the two respective siloxane complexes are different. Similarly, two siloxane polymer compositions having siloxane complexes with identical PDIs, may have different solubilities if the number average molecular weights of the respective siloxane polymers are different. For example, if two siloxane polymer compositions have siloxane complexes with identical PDIs, solubility of a siloxane polymer composition with a lower number average molecular weight may be better in the TMAH.

The siloxane polymer composition may include about 93 percent by weight to about 98 percent by weight of the organic solvent and about 2 percent by weight to about 7 percent by weight of the siloxane complex, i.e., a siloxane polymer having carboxylic acid introduced therein. When a content of the siloxane complex in the siloxane polymer composition is more than about 7 percent by weight or less than about 2 percent by weight, the resultant siloxane layer may not have a substantially uniform thickness over a substrate. For example, the siloxane complex may be present in the siloxane polymer composition in an amount of about 3 percent by weight to about 6 percent by weight.

The organic solvent of the siloxane polymer composition may be any suitable solvent capable of dissolving the siloxane polymer and capable of adjusting a viscosity of the siloxane polymer composition to form a siloxane layer with a substantially uniform thickness via spin coating. For example, the organic solvent may include an alcohol-based solvent, e.g., one or more of methanol, ethanol, butanol, propanol, isopropyl alcohol, n-butanol, 1-methoxy-2-propanol, methoxypropyl acetate, propylene glycol monomethyl ether, propylene glycol monomethyl ether acetate, isobutyl alcohol, t-butyl alcohol, and so forth. The organic solvent may be water-soluble to improve coverage of an opening by the resultant siloxane layer. An amount of the organic solvent in the siloxane polymer composition may be adjusted to obtain a desired viscosity of the siloxane polymer composition, so the amount of the organic solvent in the siloxane polymer composition may vary in accordance with the amount of the siloxane polymer, e.g., the amount of the organic solvent in the siloxane polymer composition may be in a range of about 93 percent by weight to about 98 percent by weight.

Method of Forming a Pattern

A method of forming a pattern according to example embodiments will be described in more detail below with reference to the accompanying figures. FIGS. 1-6 illustrate cross-sectional views of sequential stages in a method of forming a pattern using a siloxane polymer composition in accordance with example embodiments of the present invention.

Referring to FIG. 1, an insulation layer 102 may be formed on a substrate 100. The insulation layer 102 may be partially etched to form an opening 104 therethrough to expose a portion of the substrate 100.

The substrate 100 may include a silicon on insulator (SOI) substrate, a germanium on oxide (GOI) substrate, a metal oxide substrate, or a semiconductor substrate, e.g., a silicon substrate, a germanium substrate, a silicon-germanium substrate, and so forth. Conductive structures (not illustrated) and/or insulation structures (not illustrated) may be provided on the substrate 100.

The insulation layer 102 may be formed by depositing an oxide, e.g., a silicon oxide, on the substrate 100. For example, the insulation layer 102 may include boro-phosphor silicate glass (BPSG), phosphor silicate glass (PSG), spin on glass (SOG), undoped silicate glass (USG), flowable oxide (FOX), tetraethyl ortho silicate (TEOS), plasma enhanced-tetraethyl ortho silicate (PE-TEOS), high density plasma-chemical vapor deposition (HDP-CVD) oxide, and so forth.

The insulation layer 102 may have a thickness of about 5,000 angstroms to about 20,000 angstroms, i.e., a distance as measured from an upper surface of the substrate 100 in an upward vertical direction with respect to the substrate 100. The thickness of the insulation layer 102 may be adjusted to provide a desired a height of a conductive pattern 112 (see FIG. 5). In other words, the height of the conductive pattern 112 may depend on the thickness of the insulation layer 102, so that the thickness of the insulation layer 102 may vary to adjust the height of the conductive pattern 112.

The opening 104 may be formed through the insulation layer 102 by, e.g., an anisotropic etching process. For example, a mask (not illustrated) may be formed on the insulation layer 102, followed by partial etching of the insulation layer 102 through the mask to form the opening 104 exposing the portion of the substrate 100. The mask may include a material having a relatively high etching selectivity with respect to the insulation layer 102, e.g., a silicon nitride, a silicon oxynitride, a titanium oxynitride, and so forth. The anisotropic etching may include etching using an etching solution, e.g., a LAL solution including deionized water, an ammonium fluoride solution, and a hydrogen fluoride solution, or etching using an etching gas, e.g., an anhydrous hydrogen fluoric acid gas, an IPA gas, and/or water vapor.

In example embodiments, an etch stop layer (not illustrated) may be formed on the substrate 100 before forming the insulation layer 102. The etch stop layer may prevent an etched damage of the substrate 100 in the etching process for forming the opening 104. The etch stop layer may be formed using a nitride, e.g., a silicon nitride, or an oxynitride, e.g., a silicon oxynitride.

Figure 2:
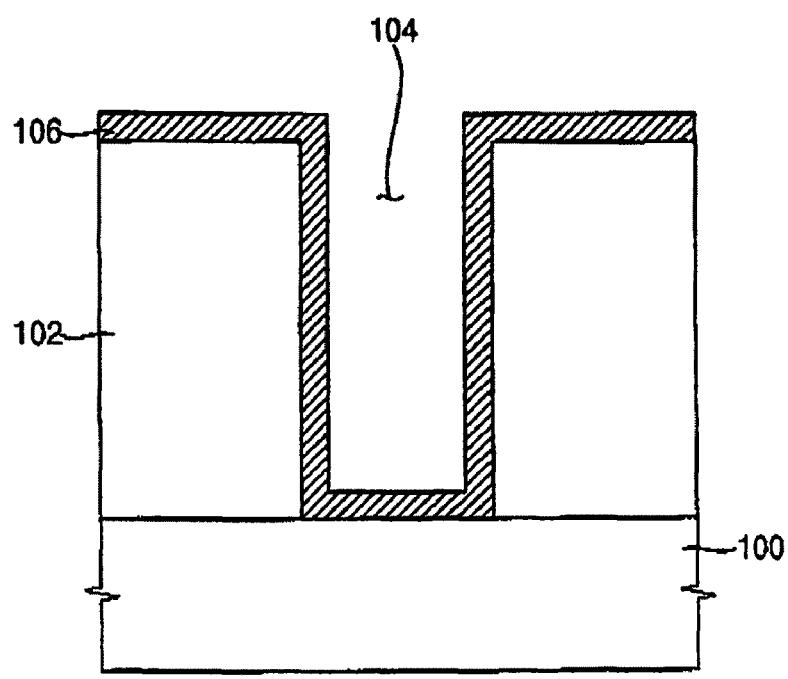

Referring to FIG. 2, a conductive layer 106 may be formed on the insulation layer 102 and on the exposed portion of the substrate 100. In particular, the conductive layer 106 may be conformally deposited on an upper surface of the insulation layer 102 and on inner surfaces of the opening 104, i.e., on sidewalls and on a bottom surface of the opening 104. The conductive layer 106 may have a substantially uniform thickness, e.g., thickness of the conductive layer 106 on the sidewalls of the opening 104 may substantially equal thickness of the conductive layer 106 on the exposed portion of the substrate 100. The conductive layer 106 may be formed using, e.g., polysilicon, a metal, and/or a metal compound. For example, the conductive layer 106 may include one or more of tungsten (W), tungsten nitride (WNx), titanium (Ti), titanium nitride (TiNx), aluminum (Al), aluminum nitride (AlNx), tantalum (Ta), tantalum nitride (TaNx), and so forth. The conductive layer 106 may have a single layer structure of polysilicon, metal, or metal compound, or a multi layer structure of polysilicon, metal, and/or metal compound. For example, the conductive layer 106 may include a titanium film and a titanium nitride film on the titanium film.

Figure 3:
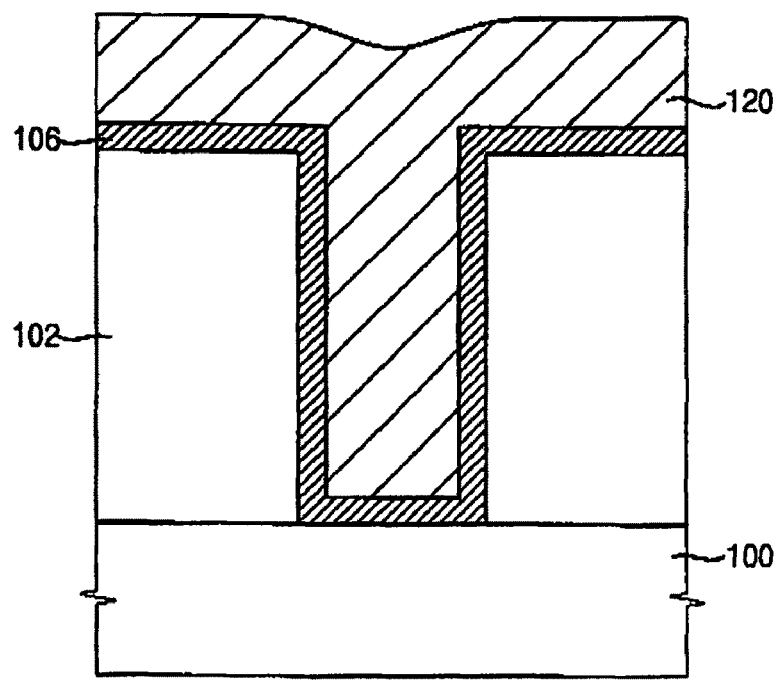

Referring to FIG. 3, a preliminary siloxane polymer composition layer (not illustrated) may be formed on the conductive layer 106 to fill the opening 104. The preliminary siloxane polymer composition layer may be formed on the conductive layer 106 by a spin coating process. The preliminary siloxane polymer composition layer may have a sufficient thickness to completely fill the opening 104, e.g., the preliminary siloxane polymer composition layer may be in the opening 104 and on an upper surface of the conductive layer 106. The preliminary siloxane polymer composition layer may be formed using a siloxane polymer composition including an organic solvent and a siloxane complex, i.e., a siloxane polymer having an introduced carboxylic acid as represented by Formula 1 above. The siloxane polymer composition may be the siloxane polymer composition described previously, and therefore, a detailed description of, e.g., its components, physical/chemical properties, and so forth, will not be repeated.

Referring to FIG. 3, once the preliminary siloxane polymer composition layer is formed, a baking process may be performed at a temperature of about 90° C. to about 120° C., e.g., at a temperature of about 90° C. to about 110° C., to harden the preliminary siloxane polymer composition into a siloxane polymer composition layer 120. An upper surface of the siloxane polymer composition layer 120 may be higher than an upper surface of the conductive layer 106, i.e., a vertical distance as measured with respect to a common reference point on an upper surface of the substrate 100, so the upper surface of the siloxane polymer composition layer 120 may not require substantial planarity in FIG. 3.

Figure 4:
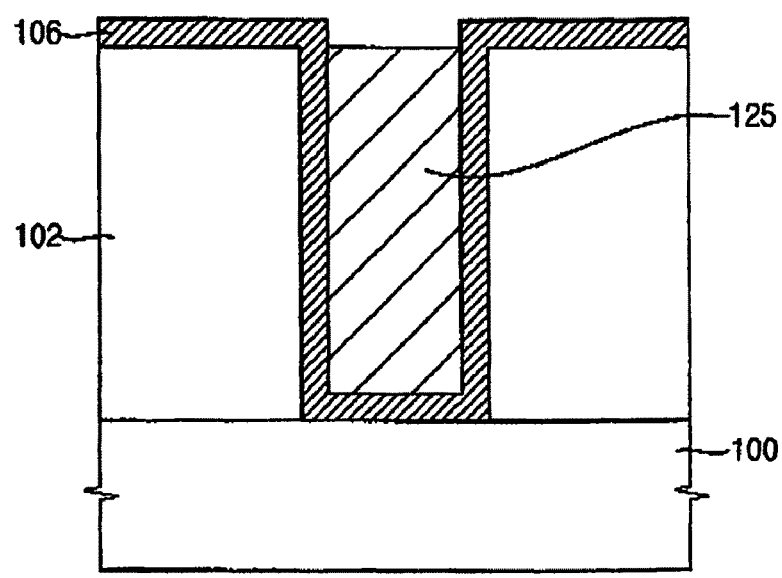

Referring to FIG. 4, an upper portion of the siloxane polymer composition layer 120 may be removed. More specifically, an upper portion of the siloxane polymer composition layer 120 may be removed using, e.g., a TMAH solution, to expose the upper surface of the conductive layer 106 and to form a siloxane polymer composition layer pattern 125 in the opening 104. A height of the siloxane polymer composition layer pattern 125 may be substantially equal to or lower than a depth of the opening 104. The TMAH solution may have a concentration of about 2 molar percent to about 3 molar percent of the TMAH.

Figure 5:
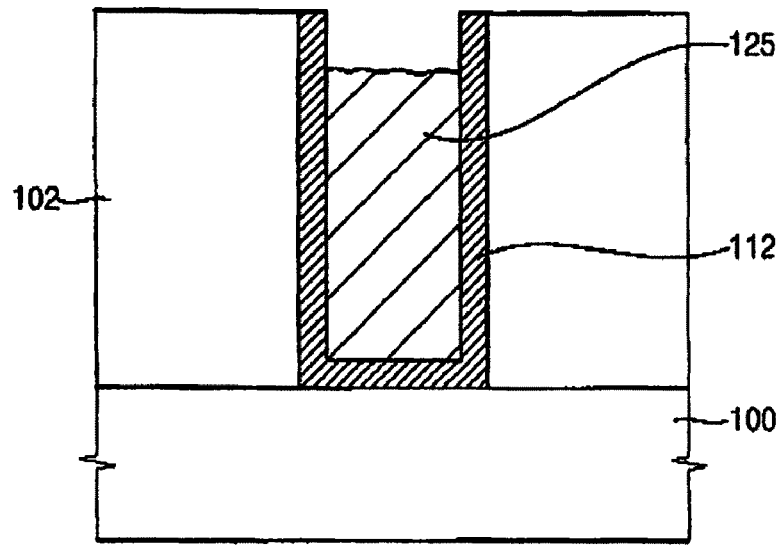

Referring to FIG. 5, the conductive layer 106 may be partially etched using the siloxane polymer composition layer pattern 125 as an etching mask. For example, an upper portion of the conductive layer 106, e.g., a portion exposed by removal of the upper portion of the siloxane polymer composition layer 120, may be removed to expose an upper surface of the insulation layer 102. Therefore, portions of the conductive layer 106 remaining inside the opening 114 may define the conductive pattern 112, i.e., portions of the conductive layer 106 on the sidewalls and on the bottom surface of the opening 104. The conductive pattern 112 may have a cylindrical structure or a hollow polygonal column structure, i.e., may be defined by the geometrical structure of the opening 104. During removal of the upper portion of the conductive layer 106 from the upper surface of the insulation layer 102, i.e., during the etching process for forming the conductive pattern 112, a portion of the conductive pattern 112 at an upper portion of the opening 104 may be etched. Accordingly, the height of the conductive pattern 112 maybe reduced relatively to an original depth of the opening 104.

A cleaning process may be performed to remove a residue remaining on the conductive pattern 112 and/or the insulation layer 102 after the etching process, i.e., a process for removing the upper portion of the conductive layer 106 from the upper surface of the insulation layer 102. The cleaning process may be performed using, e.g., an IPA solution and/or deionized water.

Figure 6:
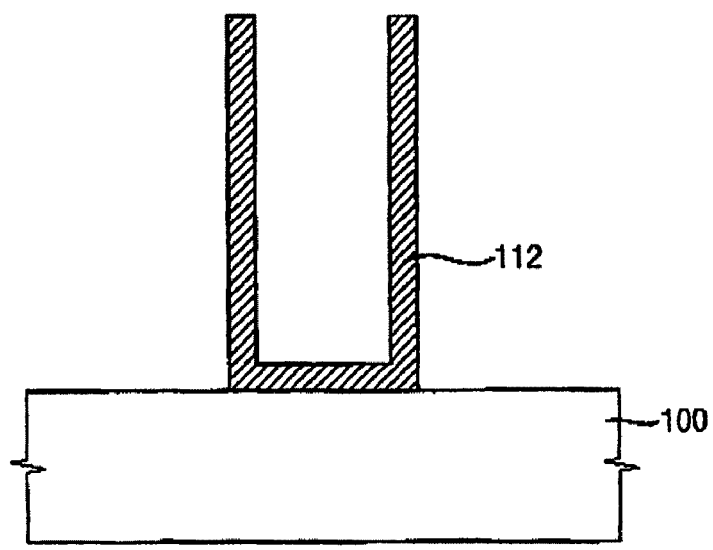

Referring to FIG. 6, the insulation layer 102 and the siloxane polymer composition layer pattern 125 may be removed using, e.g., a LAL solution including deionized water, a hydrogen fluoride solution, and an ammonium fluoride solution. For example, the insulation layer 102 and the siloxane polymer composition layer pattern 125 may be removed simultaneously, when both the insulation layer 102 and the siloxane polymer composition layer pattern 125 include silicon oxide.

After removing the insulation layer 102 and the siloxane polymer composition layer pattern 125, the conductive pattern 112 having a required structure may be completed on the substrate 100. These processes for forming the conductive pattern 112 may be employed in a formation of various patterns of a semiconductor device.

Method of Manufacturing a Semiconductor Device

A method of manufacturing a semiconductor device according to example embodiments will be described in more detail below with reference to the accompanying figures. FIGS. 7-15 illustrate cross-sectional views of sequential stages in a method of manufacturing a semiconductor device in accordance with example embodiments of the present invention.

Figure 7:
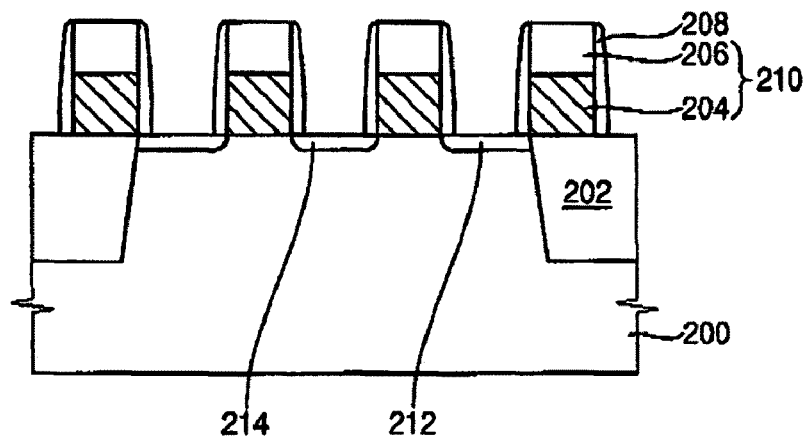
FIGS. 7-15 illustrate cross-sectional views of sequential steps in a method of manufacturing a semiconductor device in accordance with example embodiments of the present invention.

Referring to FIG. 7, an isolation layer 202 may be formed on a substrate 200 by an isolation process, e.g., a shallow trench isolation (STI) process. The isolation layer 202 may define an active region and a field region of the substrate 200. A gate structure 210 may be formed on the substrate 200. The substrate 200 may be substantially same as the substrate 100 described previously with reference to FIG. 1.

In detail, a gate insulation layer (not illustrated) may be formed on the substrate 200. The gate insulation layer may be formed using silicon oxide or a metal oxide having a high dielectric constant, e.g., one or more of a hafnium oxide, a tantalum oxide, an aluminum oxide, a zirconium oxide, and so forth. The gate insulation layer may be formed by, e.g., a thermal oxidation process, a chemical vapor deposition (CVD) process, a high density plasma-chemical vapor deposition (HDP-CVD) process, an atomic layer deposition (ALD) process, and so forth.

A first conductive layer (not illustrated) and a mask layer (not illustrated) may be sequentially formed on the gate insulation layer. The first conductive layer may be formed on the gate insulation layer using, e.g., doped polysilicon, metal, and/or metal compound. The first conductive layer may have a single layer structure or a multi layer structure. The mask layer may be formed on the first conductive layer using a material having a relatively high etching selectivity with respect to a first insulating interlayer 220 (see FIG. 8), e.g., the mask layer may include nitride or an oxynitride when the first insulating interlayer 220 includes oxide. The mask layer may be patterned to form a gate mask 206 on the first conductive layer.

The first conductive layer and the gate insulation layer may be etched through the gate mask 206 to from the gate structure 210 on the substrate 200. The gate structure 210 may include a gate insulation layer pattern (not illustrated), a gate electrode 204, and the gate mask 206 sequentially stacked on the substrate 200.

A spacer formation layer (not illustrated) may be formed on the substrate 200 to cover the gate structure 210, e.g., upper and side surfaces of the gate structure 210. The spacer formation layer may be formed using a nitride, e.g., a silicon nitride. A spacer 208 may be formed on the sidewalls of the gate structure 210 by, e.g., anisotropically etching the spacer formation layer.

Impurities may be doped into portions of the substrate 200 adjacent to the gate structure 210 using the gate structure 210 as an implantation mask. For example, as illustrated in FIG. 7, first and second impurity regions may be formed on opposite sides of the gate structure 210 to define first and second contact regions 212 and 214. For example, the first contact region 212 may correspond to a capacitor contact region for electrically connecting a lower electrode 270 (see FIG. 13), and the second contact region 214 may correspond to a bit line contact region for electrically connecting a bit line 230 (see FIG. 8). When the first and the second contact regions 212 and 214 are formed, a transistor including the gate structure 210, the first contact region 212, and the second contact region 214 may be defined on the substrate 200.

Figure 8:
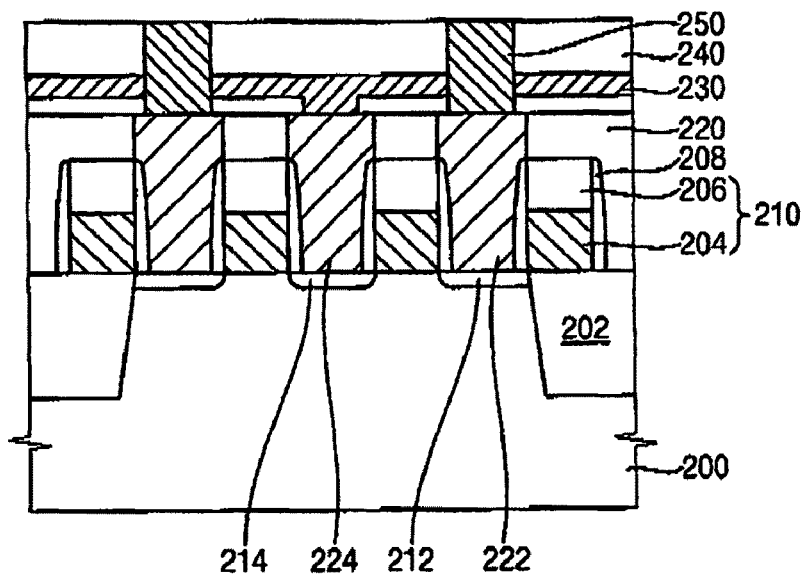

Referring to FIG. 8, a first insulating interlayer 220 may be formed on the substrate 200 to completely cover the transistor, e.g., the first insulating interlayer 220 may be thicker than a height of the gate structure 210. The first insulating interlayer 220 may be formed using an oxide, e.g., one or more of BPSG, PSG, SOG, USG, TEOS, FOX, PE-TEOS, HDP-CVD oxide, and so forth. Further, the first insulating interlayer 220 may be formed by, e.g., a CVD process, a plasma enhanced chemical vapor deposition (PECVD) process, an ALD process, an HDP-CVD process, and so forth. An upper portion of the first insulating interlayer 220 may be planarized, so the first insulating interlayer 220 may have a substantially planar upper surface.

A photoresist pattern (not illustrated) may be formed on the upper surface of the first insulating interlayer 220. The first insulating interlayer 220 may be partially etched using the photoresist pattern as an etching mask to form first and second contact holes (not illustrated) therethrough. The first and second contact holes may be may be formed through the first insulating interlayer 220 along opposite sides of the gate structure 210 to expose the first and the second contact regions 212 and 214, respectively. The photoresist pattern may be removed from the first insulating interlayer 220 by, e.g., an ashing process and/or a stripping process.

A second conductive layer (not illustrated) may be formed on the first insulating interlayer 220 to fill the first and the second contact holes. The second conductive layer may be formed using highly doped polysilicon, a metal, and/or a metal compound. For example, the second conductive layer may include one or more of tungsten, titanium, aluminum, tantalum, tungsten nitride, titanium nitride, tantalum nitride, aluminum nitride, and so forth. An upper portion of the second conductive layer may be partially removed via, e.g., a chemical mechanical polishing (CMP) process and/or an etch-back process, to expose the upper surface of the first insulating interlayer 220. Portions of the second conductive layer may remain in the first and second holes to define first and second pads 222 and 224, respectively. In other words, the first and second pads 122 and 124 may be formed on the first and second contact regions 212 and 214, respectively. Upper surfaces of the first and second pads 222 and 224 may be substantially level with the upper surface of the first insulation interlayer 220, and the first and the second pads 222 and 224 may be electrically connected to the first and the second contact regions 212 and 214, respectively. Accordingly, the first pad 222 may connect the capacitor contact region to the first contact 212 of the transistor, and the second pad 224 may connect the bit line contact region to the second contact region 214 of the transistor.

A second insulating interlayer (not illustrated) may be formed on the first insulating interlayer 220, the first pad 222, and the second pad 224. The second insulating interlayer may electrically insulate the first pad 222 from the bit line 230. The second insulating interlayer may be formed using oxide, e.g., a substantially same oxide as used to form the first insulating interlayer 220 or an oxide other than the oxide used to form the first insulating interlayer 220. An upper portion of the second insulating interlayer may be removed, so an upper surface of the second insulating interlayer may be substantially planar. The upper portion of the second insulating interlayer may be planarized by, e.g., a CMP process and/or an etch-back process.

A photoresist pattern (not illustrated) may be provided on the second insulating interlayer, and the second insulating interlayer may be partially etched to form a bit line contact hole (not illustrated) through the second insulating interlayer. The bit line contact hole may expose the second pad 224. The photoresist pattern may be removed from the second insulating interlayer by, e.g., an ashing process and/or a stripping process.

A third conductive layer (not illustrated) may be formed on the second insulating interlayer to fill the bit line contact hole. The third conductive layer may be formed using, e.g., doped polysilicon, metal, and/or metal compound. The third contact layer may include a first film of metal and metal compound and a second film of metal. For example, the third conductive layer may include a titanium/titanium nitride film and a tungsten film. The third conductive layer may be partially removed to expose an upper surface of the second insulating interlayer, so the bit line 230 may be formed in the bit line contact hole and on the second insulating interlayer. The bit line 230 may be electrically connected to the second contact region 214 through the second pad 224.

A third insulating interlayer 240 may be formed on the second insulating interlayer to cover the bit line 230. The third insulating interlayer 230 may be formed using an oxide, e.g., one or more of BPSG, PSG, SOG, USG, FOX, TEOS, PE-TEOS, HDP-CVD oxide, and so forth, and may be planarized to form a substantially planar upper surface. A photoresist pattern (not illustrated) may be provided on the third insulating interlayer 240, and the third insulating interlayer 240 and the second insulating interlayer may be partially etched to form a third contact hole (not illustrated) exposing the first pad 222. The third contact hole may correspond to a capacitor contact hole.

A fourth conductive layer (not illustrated) may be formed on the third insulating interlayer 240 to fill the third contact hole. The fourth conductive layer may be formed using, e.g., doped polysilicon, metal, and/or metal nitride. An upper portion of the fourth conductive layer may be removed via, e.g., CMP process and/or an etch-back process, to expose the upper surface of the third insulating interlayer 240. A portion of the fourth conductive layer remaining in the third contact hole may define a third pad 250 on the first pad 222. The third pad 250 may be electrically connected to the first contact region 212 through the first pad 222. An upper surface of the third pad 250 may be substantially level with the upper surface of the third insulating interlayer 240.

Figure 9:
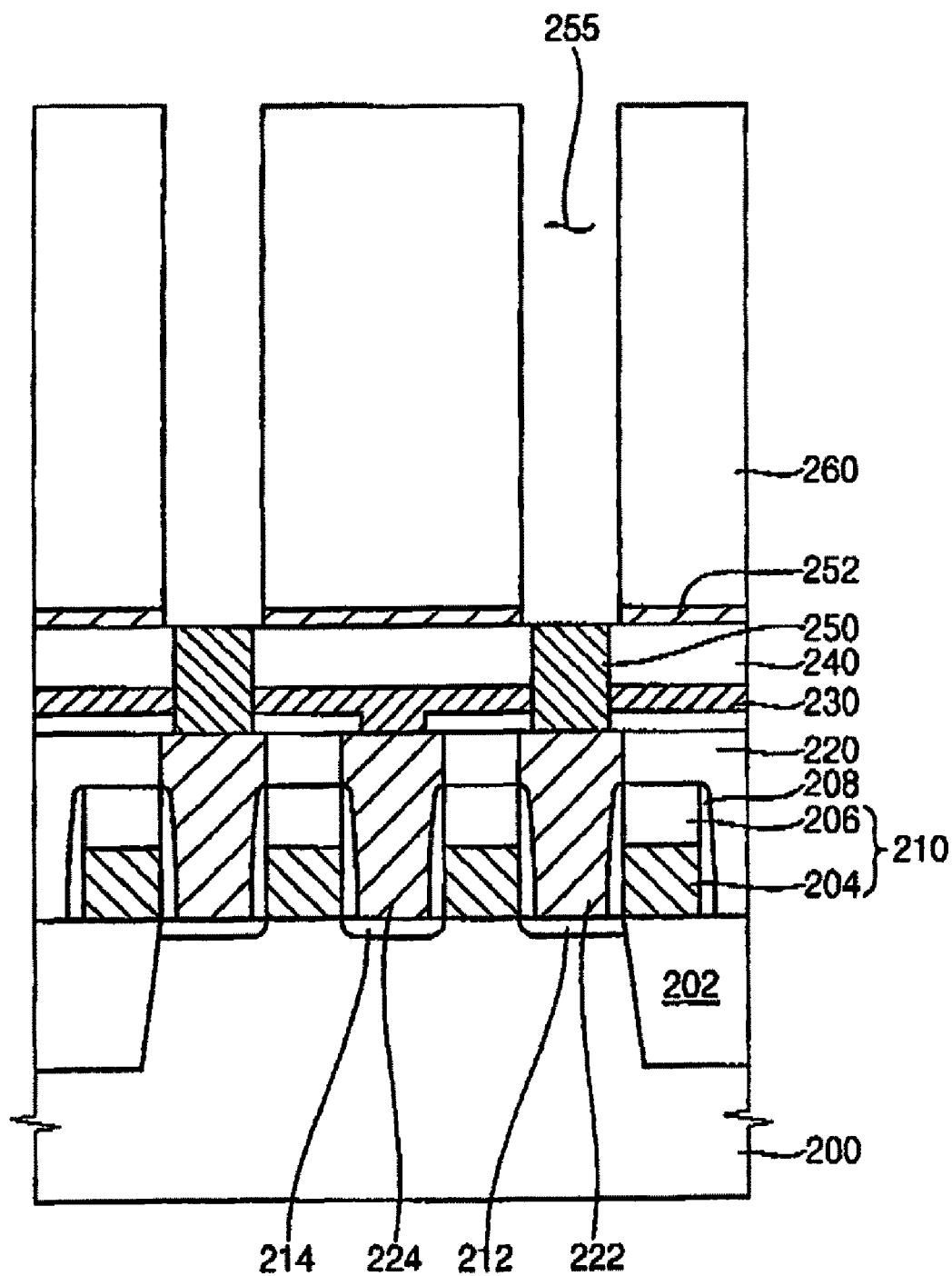

Referring to FIG. 9, an etch stop layer 252 and a mold layer 260 may be sequentially formed on the third pad 250 and on the third insulating interlayer 240. The etch stop layer 252 may be formed on the third pad 250 and on the third insulating interlayer 240 using a material having an etching selectivity relative to the third insulating interlayer 240 and the mold layer 260. For example, the etch stop layer 252 may include a nitride or a metal oxide. The etch stop layer 252 may protect the third pad 250 in a subsequent etching process for forming an opening 255 through the mold layer 260. The etch stop layer 252 may have a relatively thin thickness, e.g., about 10 angstroms to about 200 angstroms.

The mold layer 260 may be formed on the etch stop layer 252 by depositing an oxide, e.g., a silicon oxide. For example, the mold layer 260 may include one or more of TEOS, PE-TEOS, USG, SOG, BPSG, FOX, HDP-CVD oxide, and so forth. The mold layer 260 may have a multi layer structure, e.g., the mold layer 260 may include more than two oxide films. A thickness of the mold layer 260 may be adjusted according to a desired height of the lower electrode 270 of the capacitor (see FIG. 13), since the height of the lower electrode 270 may mainly depend on the thickness of the mold layer 260. Accordingly, the thickness of the mold layer 260 may vary in accordance with a desired capacity of the capacitor.

The mold layer 260 and the etch stop layer 252 may be partially etched to form the opening 255 through the mold layer 260. The opening 255 may expose the third pad 250, and may have a relatively high aspect ratio, i.e., a ratio between a depth and a width of the opening. When the mold layer 260 has a multi layer structure, the opening 255 may have a stepped sidewall in accordance with an etching rate difference between the oxide films of the mold layer 260. In the formation of the opening 255, the etch stop layer 252 may prevent damage to the third pad 250, thereby improving electrical characteristics of the semiconductor device.

Figure 10:
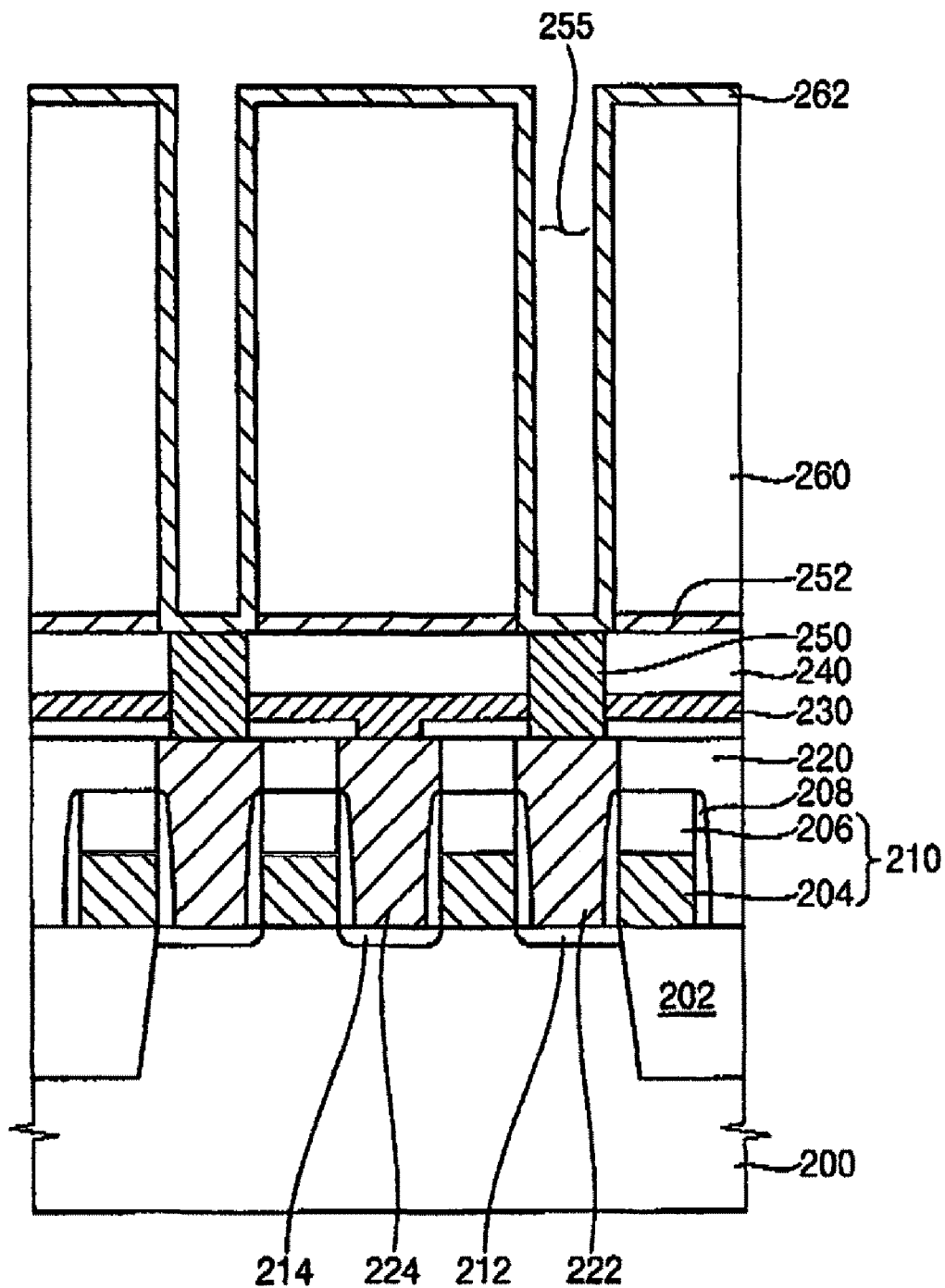

Referring to FIG. 10, a lower electrode layer 262 may be conformally formed on the mold layer 260 and in the opening 255, i.e., sidewalls of the opening 255 and upper surface of the third pad 250. The lower electrode layer 262 may be formed using a metal and/or a metal compound. For example, the lower electrode layer 262 may include one or more of titanium, titanium nitride, and so forth. The lower electrode layer 262 may have a single layer structure or a multi layer structure. For example, the lower electrode layer 262 may include a titanium film and a titanium nitride film. When the lower electrode layer 262 includes metal and/or metal compound instead of doped polysilicon, a depletion layer may not be generated between the lower electrode 270 and a dielectric layer 280 (see FIG. 15) in a subsequent process, i.e., during formation of the dielectric layer 280. Accordingly, the capacitor may have improved capacitance without generating a depletion layer.

The lower electrode layer 262 may be formed by any suitable process capable to continuously form the lower electrode layer 262 on a bottom surface and on the sidewalls of the opening 255. In other words, the lower electrode layer 262 may be formed by a process capable of providing sufficient step coverage of an opening with a relatively high aspect ratio. Further, lower electrode layer 262 may be formed by a process capable of forming a relatively thin film, while providing sufficient step coverage of the opening 255. The lower electrode layer 262 may be formed by, e.g., a CVD process, a cyclic CVD process, an ALD process, and so forth.

Figure 11:
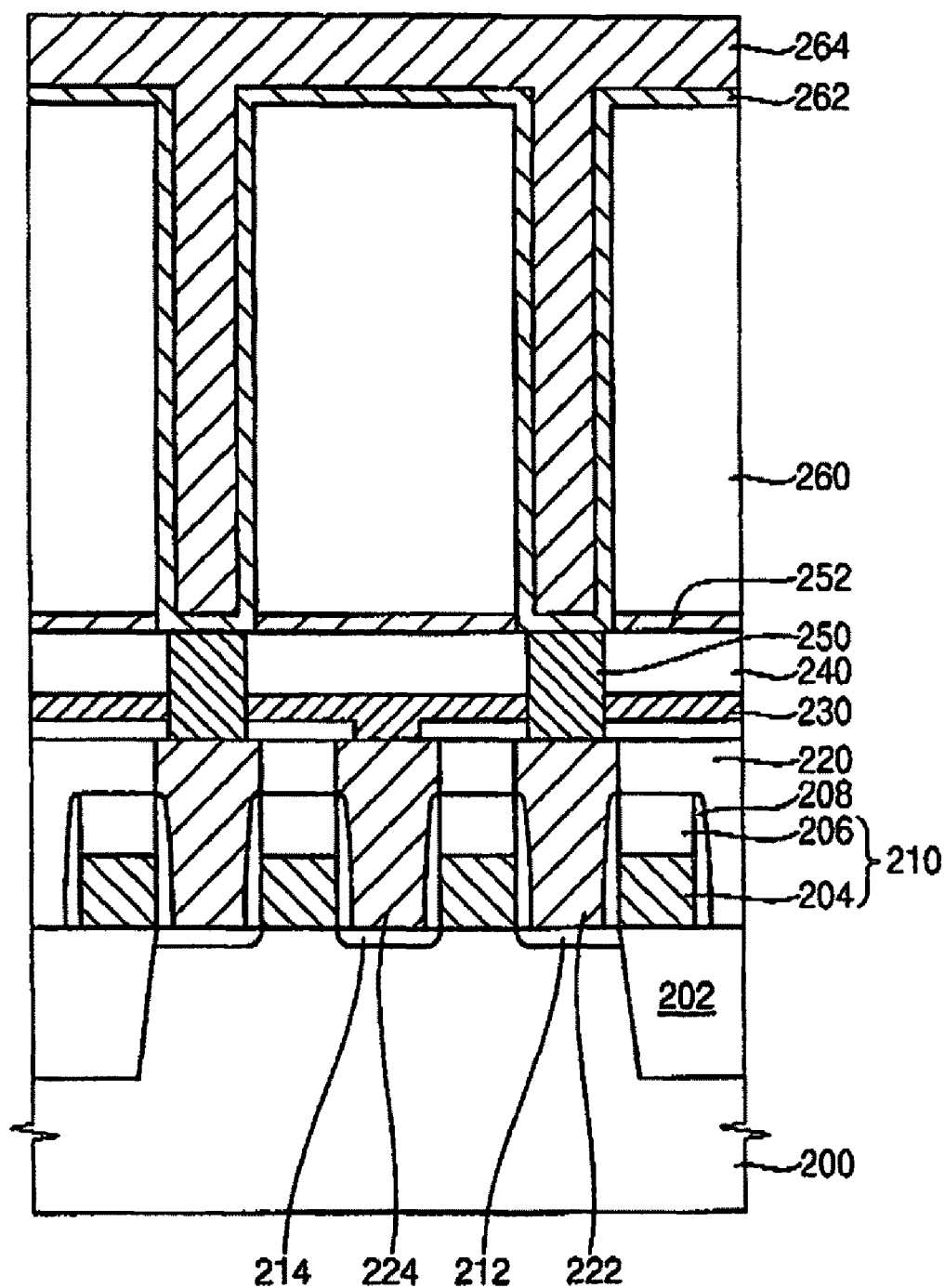

Referring to FIG. 11, a preliminary siloxane polymer layer (not illustrated) may be formed on the lower electrode layer 262 to fill the opening 255. The preliminary siloxane polymer layer may have a sufficient thickness to completely fill the opening 255, e.g., the preliminary siloxane polymer layer may uniformly fill the entire opening 255 without voids or other defects therein. The preliminary siloxane polymer layer may be formed of a siloxane polymer composition including an organic solvent and the siloxane complex represented by Formula 1, i.e., a siloxane polymer having an introduced carboxylic acid. The siloxane polymer composition represented by Formula 1 was described previously, and therefore, a detailed description of, e.g., its components, physical/chemical properties, and so forth, will not be repeated. Once the preliminary siloxane polymer layer is formed in the opening 255, a baking process may be performed to form a siloxane polymer layer 264 on the lower electrode layer 262. In other words, the preliminary siloxane polymer layer may be transformed into the siloxane polymer layer 264 by a hardening process, i.e., baking at about 90° C. to about 110° C. The siloxane polymer layer 264 may be formed by a substantially same method as described previously with reference to FIG. 3, and therefore, its detail description will not be repeated.

Figure 12:
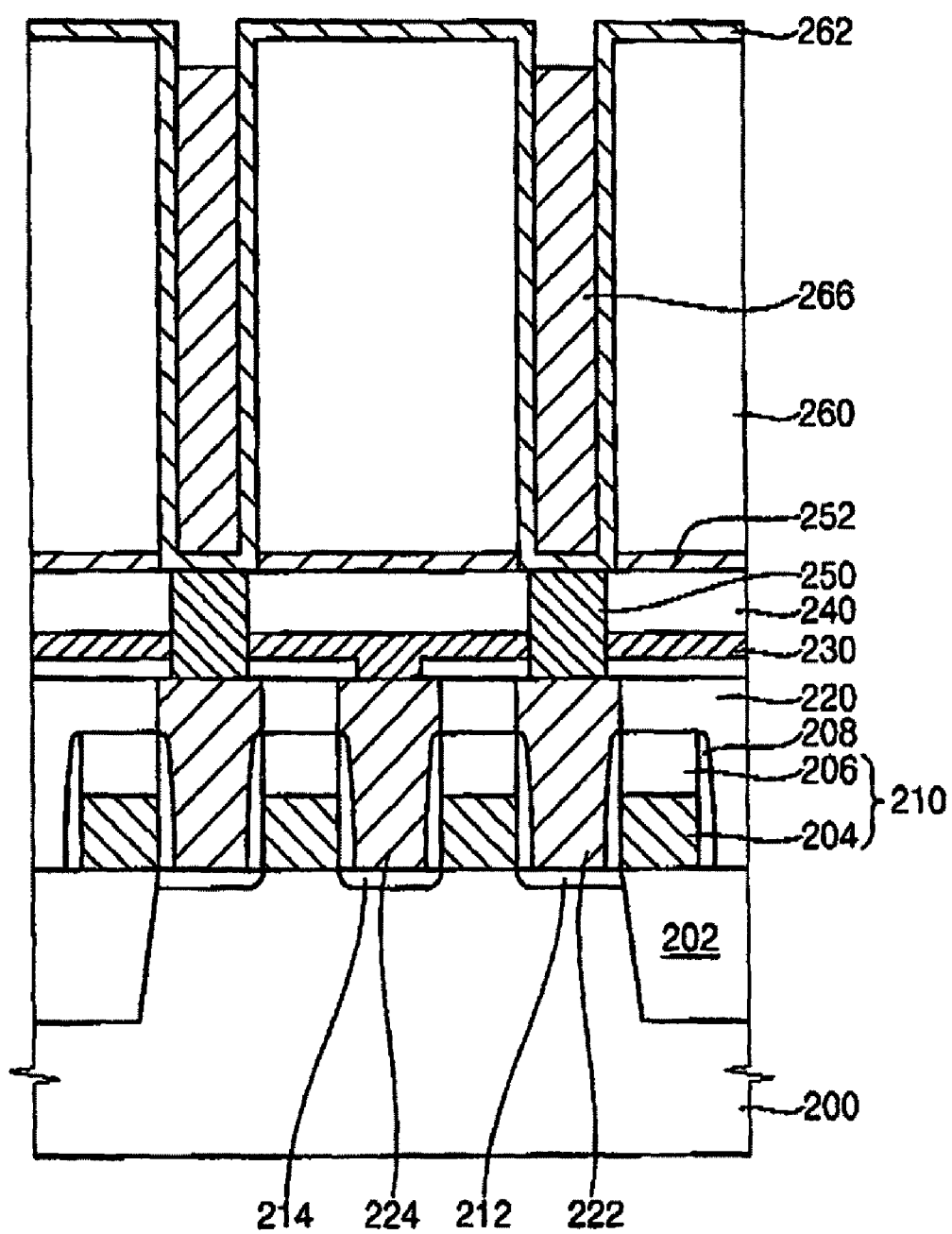
Figure 13:
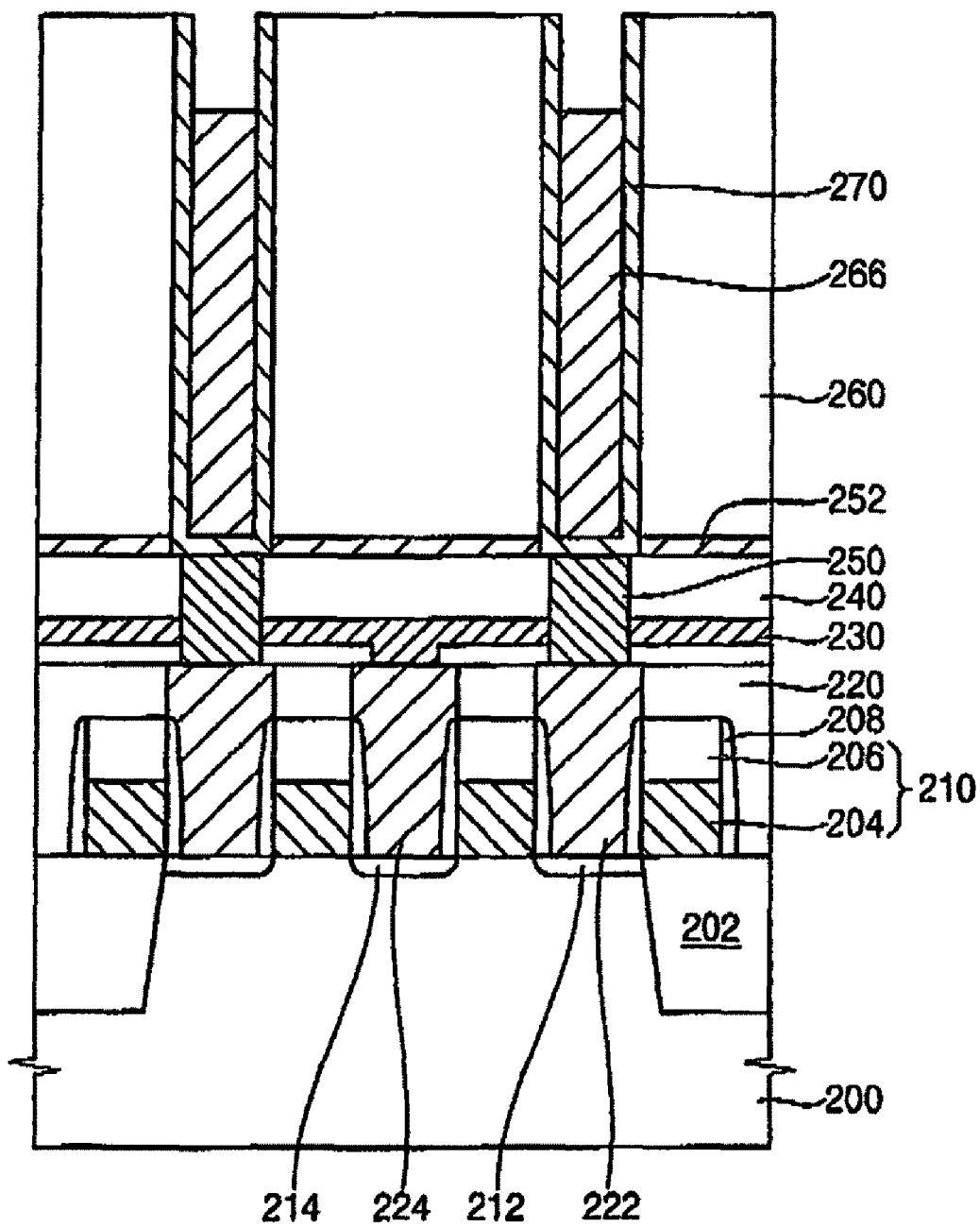

Referring to FIG. 12, an upper portion of the siloxane polymer layer 264 may be removed using a TMAH solution to form a siloxane polymer layer pattern 266 in the opening 255. A height of the siloxane polymer layer pattern 266 may be substantially lower than a depth of the opening 255. Alternatively, the siloxane polymer layer pattern 266 may have a substantially same height as the depth of the opening 255. Formation of the siloxane polymer layer pattern 266 may be substantially same as formation of the siloxane polymer composition layer pattern 125 described previously with reference to FIG. 4, and therefore, its detailed description will not be repeated Referring to FIG. 13, the lower electrode layer 262 may be partially removed from the upper surface of the mold layer 260, so portions of the lower electrode 262 remaining in the opening 255 may define the lower electrode 270. The lower electrode 270 may be formed by etching the lower electrode layer 262 using the siloxane polymer layer pattern 266 as an etching mask. The lower electrode 270 may be electrically connected to the first contact region 212 through the first pad 222 and the third pad 250. The lower electrode 270 may have a cylindrical structure or a hollow polygonal column structure in accordance with a shape of the opening 255.

Figure 14:
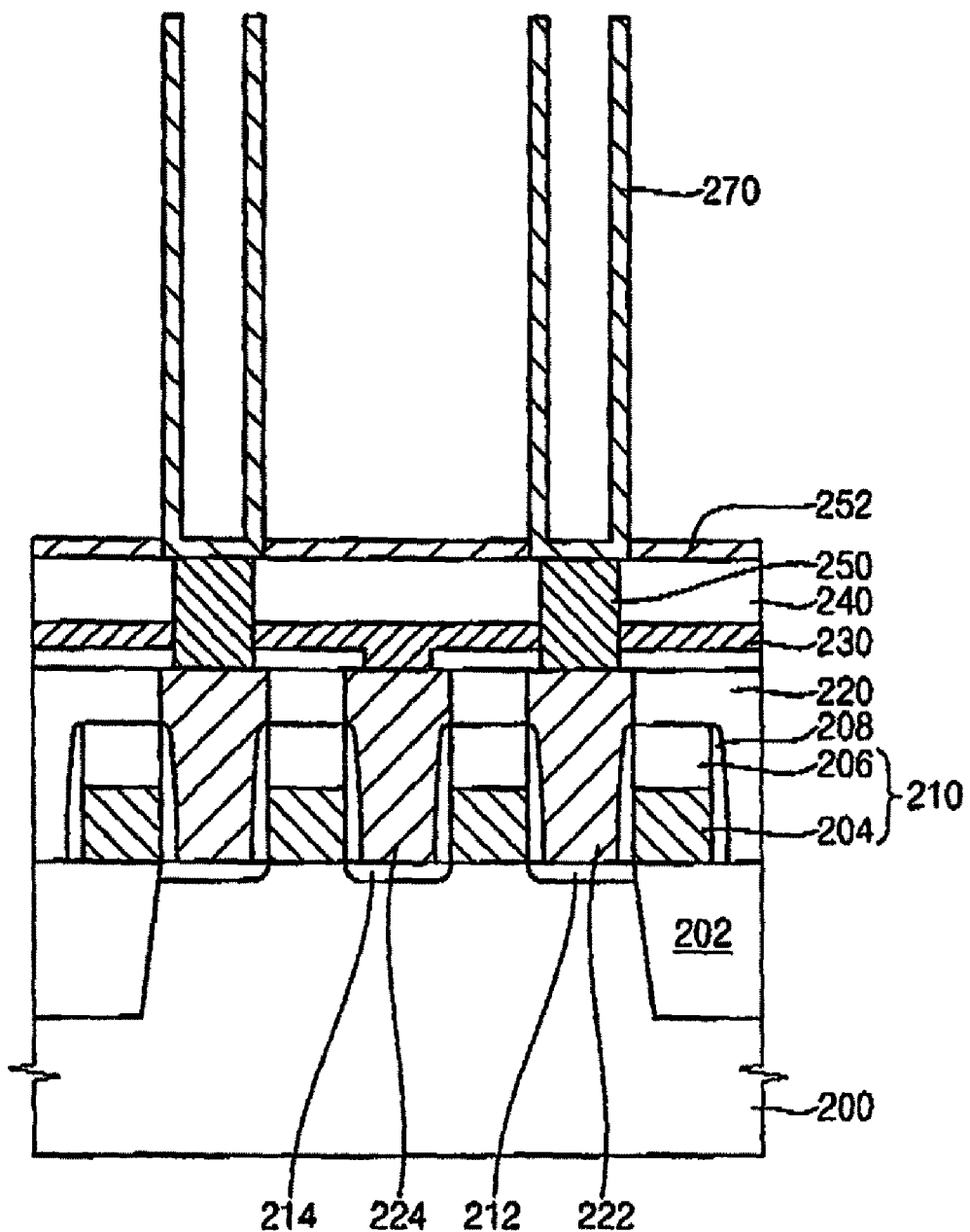

Referring to FIG. 14, the mold layer 260 and the siloxane polymer layer pattern 266 may be removed to complete the lower electrode 270 on the third pad 250. The mold layer 260 and the siloxane polymer layer pattern 266 may be etched by a wet process, e.g., using an etching solution including a hydrogen fluoride solution. For example, the etching solution may be a LAL solution including a hydrogen fluoride solution, an ammonium fluoride solution, and deionized water. Further, the etching solution may include an anti-corrosive agent and/or a surfactant. The anti-corrosive agent may prevent the lower electrode 270 from being corroded, and the surfactant may prevent the absorption of oxide relative to the lower electrode 270. For example, the mold layer 260 and the siloxane polymer layer pattern 266 may be removed simultaneously when the mold layer 260 includes an oxide.

Figure 15:
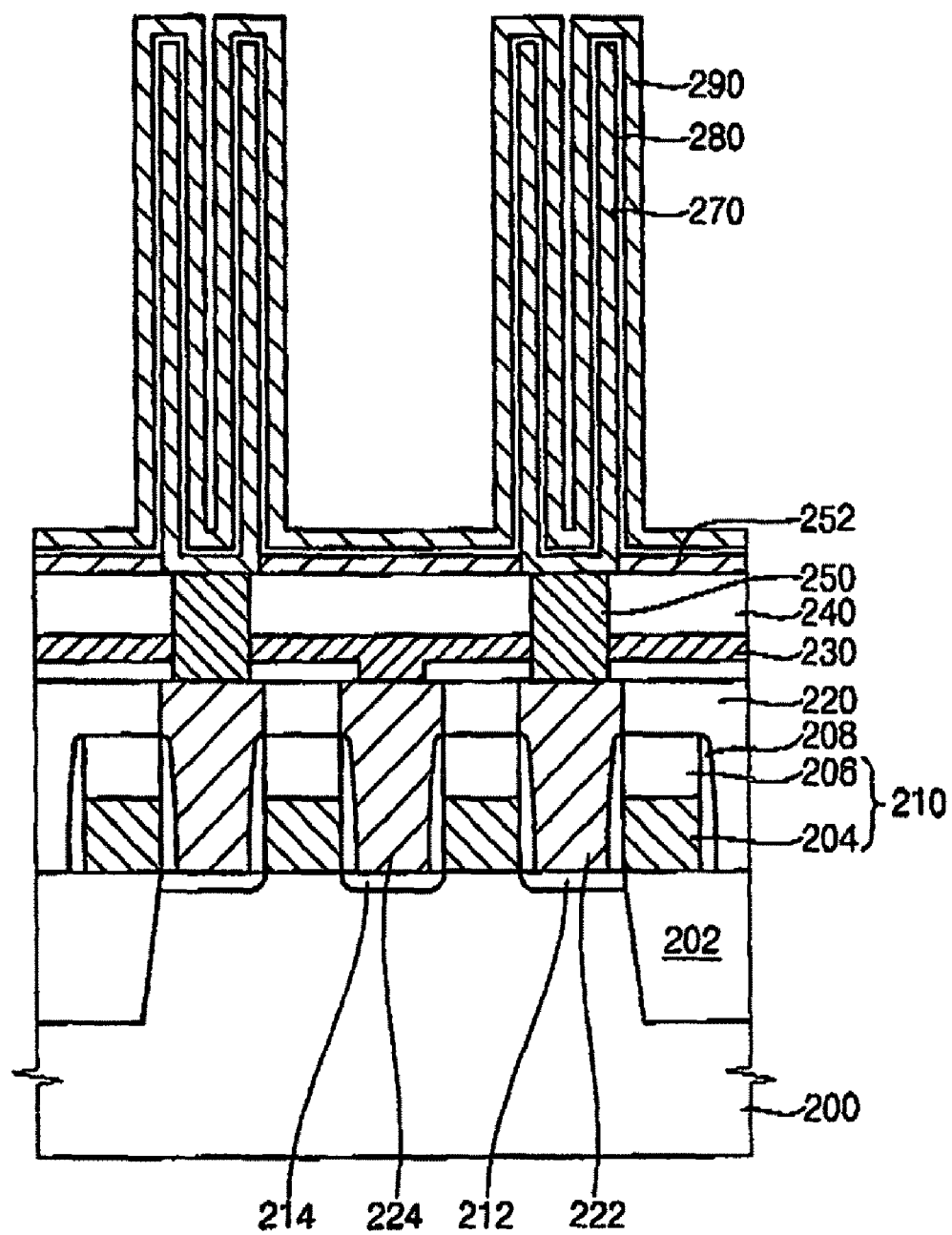

Referring to FIG. 15, the dielectric layer 280 may be formed on the lower electrode 270 using a metal oxide having a high dielectric constant. For example, the dielectric layer 280 may include an aluminum oxide, a titanium oxide, a zirconium oxide, a hafnium oxide, and so forth. The dielectric layer 280 may be uniformly formed on the lower electrode 270. An upper electrode 290 may be formed on the dielectric layer 280 using a metal, a metal compound, and/or doped polysilicon. The upper electrode 290 may have a single layer structure or a multi layer structure. For example, the upper electrode 290 may include a doped polysilicon film, a metal film, and/or a metal compound film.

EXAMPLES

Solubilities of Siloxane Layers Based on Molecular Weights

Examples 1-2 siloxane polymer compositions were prepared according to embodiments of the present invention, i.e., a siloxane polymer composition including a quantified siloxane polymer having a number average molecular weight of about 4,000 to about 5,000, as illustrated in Table 1 below. Next, the siloxane polymer compositions were coated on respective substrates and hardened at a temperature of about 90° C. to about 120° C. to form siloxane layers. The solubilities of the siloxane layers were measured by using a TMAH solution having a molar concentration of about 2.8 percent.

Comparative Examples 1-2 siloxane polymer compositions were prepared according to a substantially same process as in Examples 1-2, with the exception of using quantified siloxane polymers having a number average molecular weight of 6,000 and 3,900, respectively, as illustrated in Table 1 below. The solubilities of the siloxane layers formed in Comparative Examples 1-2 were measured relative to the TMAH solution having a molar concentration of about 2.8 percent, and were compared to the solubilities of the siloxane layers of Examples 1-2. Results are reported in Table 1 below.

TABLE 1

|  | Number Average Molecular Weight | Solubility |
| --- | --- | --- |
| Example 1 | 4,600 | ○ |
| Example 2 | 5,000 | ○ |
| Comparative Example 1 | 6,000 | X |
| Comparative Example 2 | 3,900 | X |

As shown in Table 1, the siloxane layers of Examples 1-2 were completely dissolved in the TMAH solution, as indicated by "O." The siloxane layers of Comparative Examples 1-2 were not dissolved in the TMAH solution, as indicated by "X."

Removal Efficiency of a Siloxane Polymer Composition Layer

Example 5

A siloxane polymer composition layer was formed on a substrate using a siloxane polymer composition according to an embodiment of the present invention, i.e., a siloxane composition including a siloxane polymer with an introduced carboxylic acid as represented in Formula 1. The siloxane polymer composition layer was formed to a thickness of 1,000 angstroms as measured from an upper face of the substrate. The removal efficiency of the siloxane polymer composition layer was observed while providing a TMAH solution having a molar concentration of 2.8 percent onto the siloxane polymer composition layer. The result is illustrated in FIG. 16.

Figure 16:
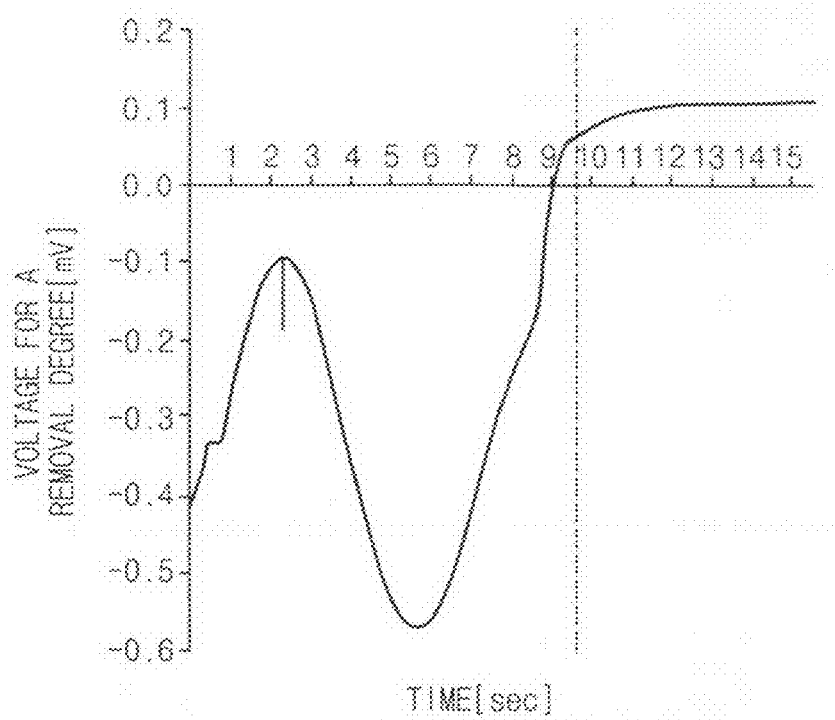
FIG. 16 illustrates a graph of removal efficiency of a siloxane layer with a TMAH solution in accordance with example embodiments of the present invention.

FIG. 16 illustrates a graph of the removal efficiency of the siloxane polymer composition layer relative to the TMAH solution. In FIG. 16, the X-axis represents a length of time of providing the TMAH solution onto the siloxane polymer composition layer, and the Y-axis represents voltage for identifying a removal degree of the siloxane polymer composition layer.

As illustrated in FIG. 16, the voltage for identifying the removal degree of the siloxane polymer composition layer was converted from a negative (−) value to a positive (+) value after supplying the TMAH solution onto the siloxane polymer composition layer for a time period between 9 seconds and 10 seconds. In other words, the siloxane polymer composition layer, i.e., a layer having a thickness of 1,000 angstroms, was completely removed from the substrate after being contacted by the TMAH solution for about 10 seconds.

Figure 17:
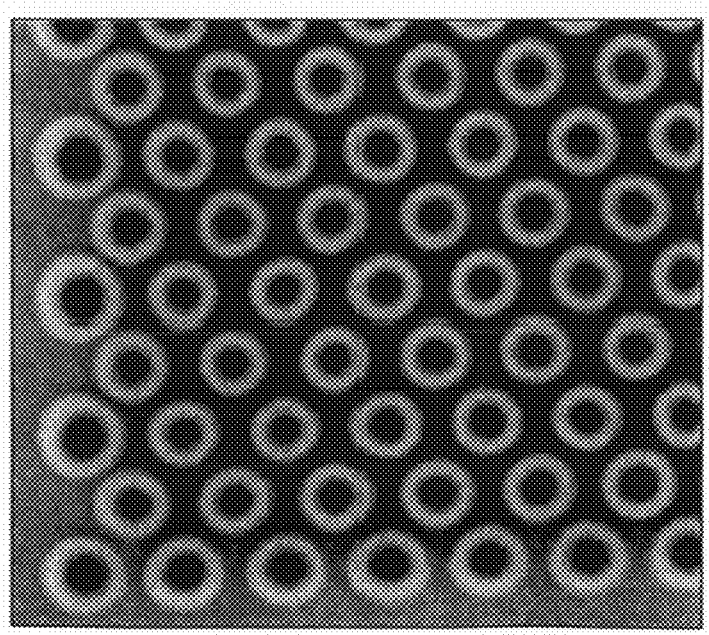
FIG. 17 illustrates a scanning electron microscope (SEM) photograph of a cylindrical conductive layer pattern on a substrate in accordance with example embodiments of the present invention.

Example 6 a mold layer of silicon oxide having an opening was formed on a substrate, and a conductive layer was formed on the mold layer and on a sidewall of the opening. The opening in the mold layer had a depth of 1,000 angstroms. Then, a buffer layer of siloxane polymer composition was formed on the conductive layer to fill up the opening. The buffer layer was formed using the siloxane polymer composition according to embodiments of the present invention. After forming a cylindrical conductive layer pattern in the opening, the mold layer and the buffer layer were simultaneously removed using a LAL solution. Etched residues of the mold layer and the buffer layer on the cylindrical conductive layer pattern were observed using scanning electron microscopy. FIG. 17 illustrates a SEM photograph of the cylindrical conductive layer pattern on the substrate.

As illustrated in FIG. 17, the mold layer and the buffer layer were completely removed from the cylindrical conductive layer pattern using the LAL solution when the mold layer included silicon oxide and the buffer layer was formed of the siloxane polymer composition according to embodiments of the present invention. No etch residue from the mold layer or from the buffer layer was observed on the cylindrical conductive layer pattern after using the LAL solution.

According to example embodiments of the present invention, a siloxane layer may effectively fill an opening having a relatively high aspect ratio when the siloxane layer is formed of a siloxane polymer composition including an organic solvent and a siloxane polymer with an introduced carboxylic acid. Further, the siloxane layer may be efficiently removed using a TMAH solution, and the siloxane layer may be simultaneously removed together with an oxide layer. When the siloxane layer is employed in the formation of a conductive layer pattern or a lower electrode having a relatively high aspect ratio, the conductive layer pattern may have a desired structure and a semiconductor device including the lower electrode may have improved electrical characteristics and storage capacity through simplified processes.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a pattern, comprising:
    forming an opening through an insulation layer on a substrate, the opening partially exposing the substrate;
    forming a conductive layer in the opening and on the insulation layer;
    forming a siloxane layer on the conductive layer to fill the opening, the siloxane layer including
        an organic solvent in an amount of about 93 percent by weight to about 98 percent by weight, based on a total weight of the siloxane layer, and
        a siloxane complex in an amount of about 2 percent by weight to about 7 percent by weight, based on the total weight of the siloxane layer, the siloxane complex including a siloxane polymer with an introduced carboxylic acid and being represented by Formula 1 below,

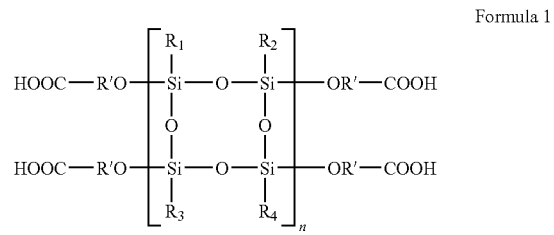

Formula 1 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5H_{10}$ or $C_6H_{12}$, and n represents a positive integer so the siloxane polymer of the siloxane complex has a number average molecular weight of about 4,000 to about 5,000;
    forming a siloxane pattern in the opening by partially removing the siloxane layer; and
    forming a conductive layer pattern by etching the conductive layer using the siloxane pattern as an etching mask.

2. The method as claimed in claim 1, further comprising:
    forming the conductive layer on the substrate, sidewalls of the opening, and the insulation layer;
    forming a preliminary siloxane layer on the conductive layer to fill the opening;
    forming the siloxane layer by hardening the preliminary siloxane layer; and
    removing the siloxane layer pattern and the insulation layer after forming the conductive layer pattern.

3. The method as claimed in claim 2, wherein hardening the preliminary siloxane layer includes a baking process performed at a temperature of about 90° C. to about 110° C.

4. The method as claimed in claim 2, wherein the siloxane pattern and the insulation layer are removed simultaneously.

5. The method as claimed in claim 4, wherein the siloxane pattern and the insulation layer are removed using an etching solution including a hydrogen fluoride solution, an ammonium fluoride solution, and deionized water.

6. The method as claimed in claim 1, wherein the siloxane pattern is formed by partially removing the siloxane layer using a tetramethyl ammonium hydroxide (TMAH) solution.

7. A method of manufacturing a semiconductor device, comprising:

forming a mold layer on a substrate with a conductive structure, the mold layer having an opening exposing the conductive structure;

conformally forming a conductive layer on the conductive structure, sidewalls of the opening, and the mold layer;

forming a siloxane layer on the conductive layer to fill the opening, the siloxane layer including an organic solvent in an amount of about 93 percent by weight to about 98 percent by weight, based on a total weight of the siloxane layer, and a siloxane complex in an amount of about 2 percent by weight to about 7 percent by weight, based on the total weight of the siloxane layer, the siloxane complex including a siloxane polymer with an introduced carboxylic acid and being represented by Formula 1 below,

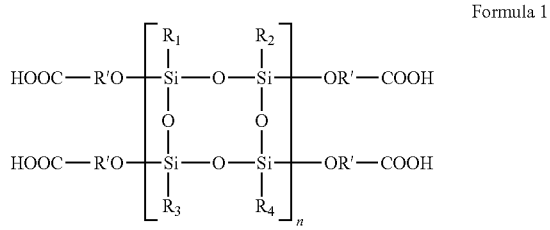

Formula 1 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5H_{10}$ or $C_6H_{12}$, and n represents a positive integer so the siloxane polymer of the siloxane complex has a number average molecular weight of about 4,000 to about 5,000;

forming a siloxane pattern in the opening by partially removing the siloxane layer using a TMAH solution;

forming a lower electrode by partially removing the conductive layer from the mold layer by using the siloxane pattern as an etching mask;

removing the siloxane pattern and the mold layer;

forming a dielectric layer on the lower electrode; and forming an upper electrode on the dielectric layer.

8. The method as claimed in claim 7, wherein the siloxane layer is formed by baking a composition of the siloxane complex and organic solvent at a temperature of about 90° C. to about 110° C., and the siloxane polymer of the siloxane complex is formed on a crosslinking product of a siloxane compound.

9. The method as claimed in claim 7, wherein the siloxane complex is obtained by reacting carboxylic acid chloride (R'—Cl—COOH) with a hydroxyl group of a siloxane polymer having a number average molecular weight of about 4,000 to about 5,000, and is represented by Formula 2 below,

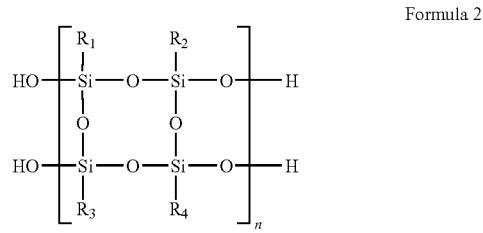

Formula 2 wherein each of $R_1$, $R_2$ $R_3$, and $R_4$ independently represents H, OH, $CH_3$, $C_2H_5$, $C_3H_7$, $C_4H_9$ or $C_5H_{11}$, R' represents $CH_2$, $C_2H_4$, $C_3H_6$, $C_4H_8$, $C_5H_{10}$ or $C_6H_{12}$, and n represents a positive integer so the siloxane polymer has the number average molecular weight of about 4,000 to about 5,000.

10. The method as claimed in claim 7, wherein the siloxane complex has a PDI of about 1.3 to about 1.8.

11. The method as claimed in claim 7, wherein the siloxane complex is represented by Formula 4 below,

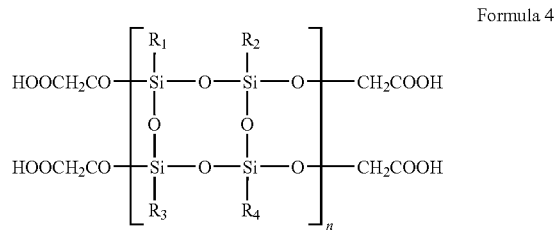

Formula 4 wherein each of $R_1$, $R_2$ $R_3$, and $R_4$ independently represents H, OH, $CH_3$, $C_2H_5$, $C_3H_7$, $C_4H_9$ or $C_5H_{11}$, and n represents a positive integer so the siloxane polymer has the number average molecular weight of about 4,000 to about 5,000.

12. The method as claimed in claim 11, wherein R' represents $CH_2$, $C_2H_4$, $C_3H_6$, $C_4H_8$, $C_5H_{10}$ or $C_6H_{12}$.

13. The method as claimed in claim 7, wherein the siloxane pattern and the mold layer are removed simultaneously.

14. The method as claimed in claim 13, wherein the siloxane pattern and the mold layer are removed using an etching solution including a hydrogen fluoride solution, an ammonium fluoride solution, and deionized water.

* * * * *